(12) United States Patent
Chang et al.

(10) Patent No.: US 8,988,652 B2
(45) Date of Patent: Mar. 24, 2015

(54) METHOD AND APPARATUS FOR ULTRAVIOLET (UV) PATTERNING WITH REDUCED OUTGASSING

(71) Applicant: Taiwan Semiconductor Manufacturing Co., Ltd., Hsin-Chu (TW)

(72) Inventors: Shu-Hao Chang, Taipei (TW); Tsiao-Chen Wu, Jhudong Township (TW); Chia-Hao Hsu, Hsinchu (TW); Chia-Chen Chen, Hsinchu (TW); Ying-Yu Chen, Lotung (TW); Tzu-Li Lee, Huwei (TW); Shang-Chieh Chien, New Taipei (TW); Jeng-Horng Chen, Hsin-Chu (TW); Anthony Yen, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 102 days.

(21) Appl. No.: 13/654,750

(22) Filed: Oct. 18, 2012

(65) Prior Publication Data

US 2014/0111781 A1   Apr. 24, 2014

(51) Int. Cl.
*G03F 7/20* (2006.01)

(52) U.S. Cl.
CPC .......... *G03F 7/2002* (2013.01); *G03F 7/70916* (2013.01); *G03F 7/70933* (2013.01); *G03F 7/20* (2013.01)

USPC .................................. 355/30; 355/72; 355/77

(58) Field of Classification Search
CPC ............ G03F 7/70233; G03F 7/70841; G03F 7/70908; G03F 7/70916; G03F 7/70933
USPC ........... 250/492.2; 355/30, 67, 72, 77; 378/34
See application file for complete search history.

(56) References Cited

U.S. PATENT DOCUMENTS

| | | | | |
|---|---|---|---|---|
| 5,559,584 | A | * | 9/1996 | Miyaji et al. ..................... 355/73 |
| 6,970,228 | B1 | * | 11/2005 | Aoki et al. ........................ 355/30 |
| 2006/0215137 | A1 | * | 9/2006 | Hasegawa et al. ............... 355/53 |
| 2009/0231707 | A1 | * | 9/2009 | Ehm et al. ...................... 359/509 |

OTHER PUBLICATIONS

"Dynamic Gas Lock Works", TNO Magazine, Sep. 2009, 1 page.

* cited by examiner

*Primary Examiner* — Colin Kreutzer
(74) *Attorney, Agent, or Firm* — Duane Morris LLP (57) ABSTRACT

A method and apparatus for ultraviolet (UV) and extreme ultraviolet (EUV) lithography patterning is provided. A UV or EUV light beam is generated and directed to the surface of a substrate disposed on a stage and coated with photoresist. A laminar flow of a layer of inert gas is directed across and in close proximity to the substrate surface coated with photoresist during the exposure, i.e. lithography operation. The inert gas is exhausted quickly and includes a short resonance time at the exposure location. The inert gas flow prevents flue gasses and other contaminants produced by outgassing of the photoresist, to precipitate on and contaminate other features of the lithography apparatus.

18 Claims, 7 Drawing Sheets

METHOD AND APPARATUS FOR ULTRAVIOLET (UV) PATTERNING WITH REDUCED OUTGASSING

TECHNICAL FIELD

The disclosure relates to semiconductor device manufacturing technology. More particularly, the disclosure relates to patterning semiconductor devices using ultraviolet (UV) and, more particularly, extreme ultraviolet (EUV) radiation using an apparatus and method that reduce outgassing during the patterning operation.

BACKGROUND

EUV ("extreme ultraviolet") lithography systems are used in the semiconductor manufacturing industry to produce feature sizes of smaller dimensions and patterns with superior resolution compared to other lithography systems. EUV lithography systems utilize light with very small wavelengths in the vicinity of about 13.5 nanometers which lies in the spectrum between visible light and x-ray. The shortened wavelength enables higher resolution and the accurate production of smaller features. EUV optics in EUV lithography systems utilize mirrors and other reflective surfaces to direct the EUV light beam to the reticle and substrate being patterned. Reflective surfaces are used instead of lenses because all matter absorbs EUV radiation. Quartz lenses would absorb a lot of EUV photons.

The EUV photolithography system produces a pattern on a photoresist coated substrate. The pattern is generally produced by directing beams of EUV light to a partially reflective, partially absorbent reticle that includes a device pattern. The EUV light beams are reflected from the reticle and impinge upon the substrate surface where the light radiation chemically alters the exposed photoresist. Because air also absorbs EUV photons, EUV lithography operations often take place in a chamber maintained at or near vacuum conditions, i.e. at low pressure.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides a method and apparatus for reducing outgassing in a lithography chamber of an EUV or UV photolithography tool. A thin layer of inert gas is directed across the surface of the photoresist coated substrate being exposed to EUV light beams, i.e. being patterned. Various EUV light sources are used in various embodiments to generate EUV light. In other embodiments, ultraviolet (UV) radiation, is used. The presence of the inert gasses flowing across the surface of the photoresist coated substrate, reduces outgassing and prevents any outgassed contaminants from becoming deposited on components in the lithography tool. Inert gasses are advantageous because they will not easily react with the photons from EUV light to produce reactive radicals. The inert gasses are exhausted quickly and the flow rate is controlled to produce a short resonance time of the inert gas in the lithography system to avoid significant absorption of the EUV photons by the inert gas. In some embodiments, the inert gas flow is a laminar layer of inert gas produced over the substrate surface. The inert gas flow prevents buildup of contaminants on the reflective surfaces in the EUV photolithography system.

In some embodiments, the inert gas flow is used in conjunction with the flow of hydrogen or other suitable gasses used to essentially separate the reflective surfaces from the contaminants that are liberated by outgassing. In some embodiments, the flow of inert gasses across the surface of the substrate being patterned, is used in conjunction with a laminar flow of inert gas across a reflective surface of one or more of the reflective members used to direct the EUV light beam from the light source to the reticle and substrate surface.

The EUV exposure apparatus includes an extreme ultraviolet light source that emits photons when it becomes suitably energized. Photons of EUV light are generally produced by electrons due to ionization. The light emitted by the EUV light source includes a wavelength of about 13.5 nm in some embodiments but other suitably short wavelengths are used in other embodiments. In other embodiments, ultraviolet (UV) radiation, is used.

The apparatus includes one or more reflective members with reflective surfaces that direct the EUV or UV light beam from the light source to a reticle. Light reflected from the reticle is then directed to a substrate where it forms a pattern by exposing only portions of the substrate. The apparatus also includes a stage on which the substrate is disposed. Because air absorbs EUV photons, the coated substrate is in a chamber in which the EUV lithography operations take place. The chamber is free of air and includes a pressure controller that maintains a low pressure at or near vacuum levels, in some embodiments. The chamber is void of gasses other than the inert gasses and $H_2$ or other suitable gasses described herein, in some embodiments.

A gas delivery source includes one or several gas sources and gas flow members, i.e. tubes, pipes, channels and other conduits that direct an inert gas to the substrate surface and cause it to flow across the substrate surface during the exposure operation. A laminar flow of a sheet of inert gas is used in many embodiments. An exhaust system with exhaust ports exhausts the inert gas such that the inert gas has a short resonance time within the chamber. The resonance time is sufficiently small to minimize absorption of the EUV photons by the inert gas, thereby avoiding a loss of efficiency in the exposure operation.

Figure 1A:
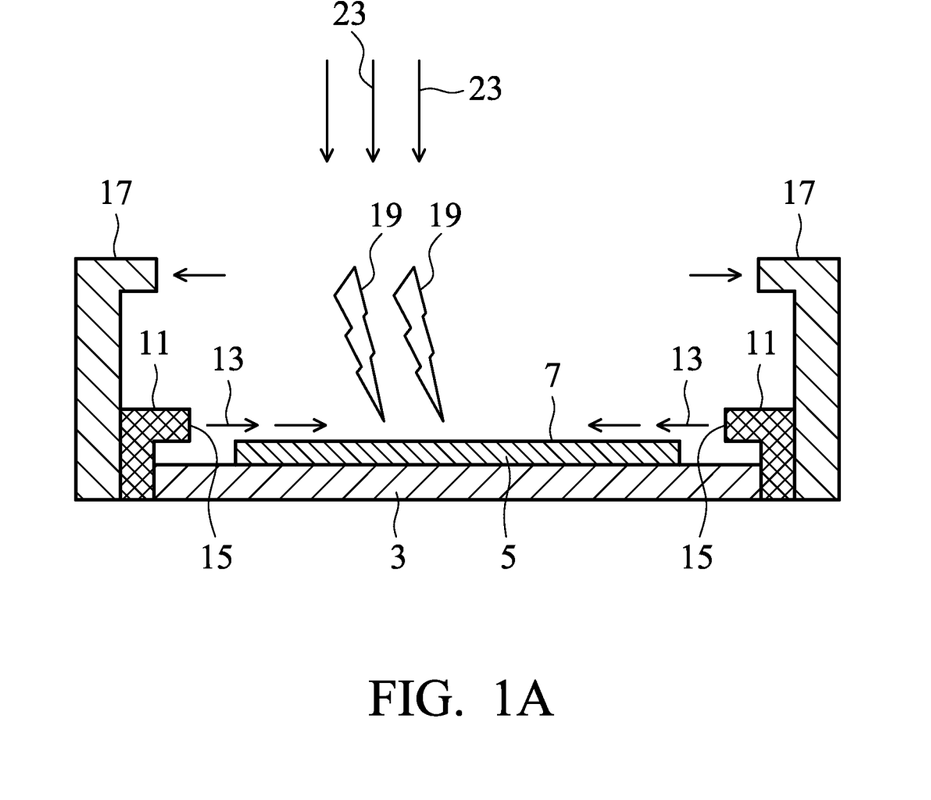
FIGS. 1A and 1B illustrate a side and plan view, respectively, of an arrangement for reducing outgassing in an EUV lithography apparatus according to an embodiment of the disclosure.
Figure 1B:
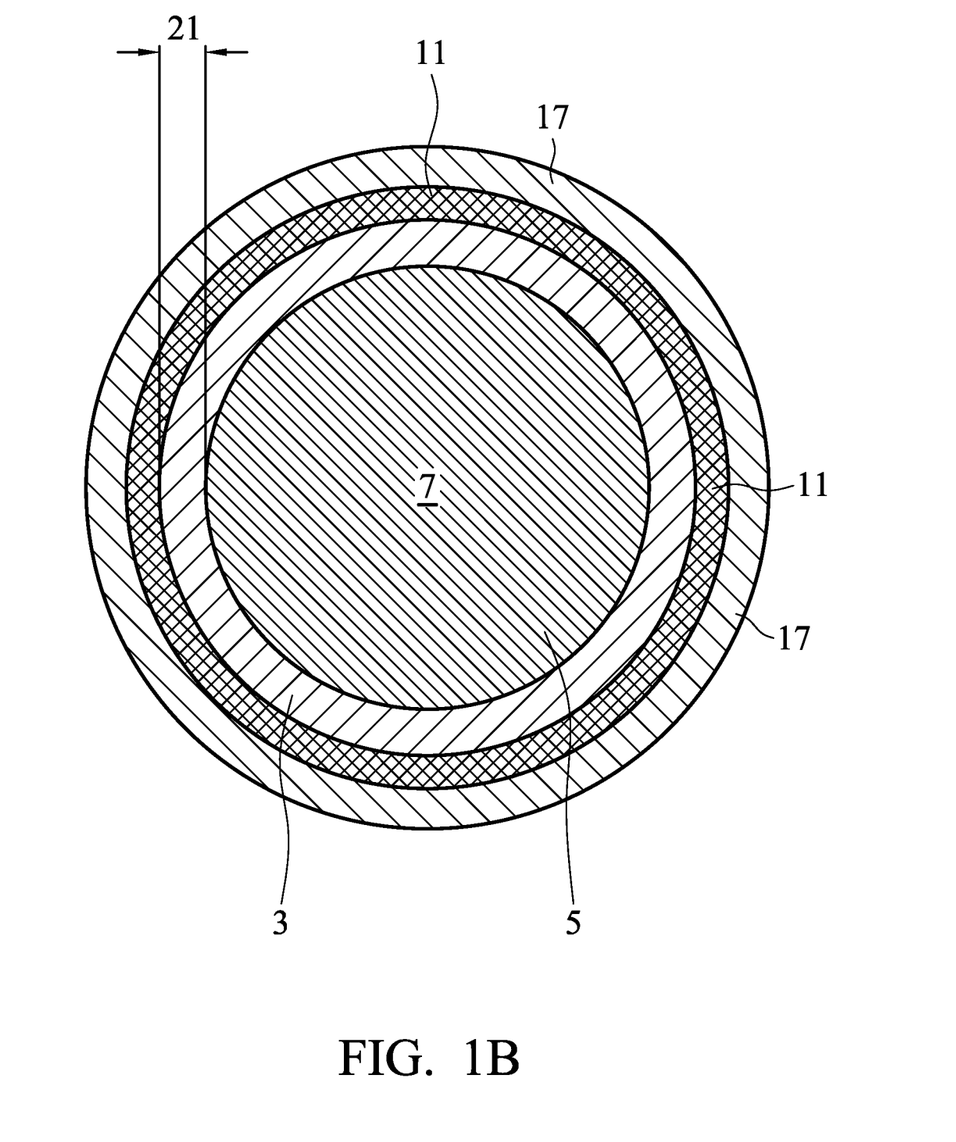

FIGS. 1A and 1B are a side and plan view, respectively, of a UV lithography apparatus in accordance with various embodiments of the present disclosure. A UV lithography apparatus includes stage 3. In the illustrated embodiment, substrate 5 with surface 7 is disposed on stage 3. Stage 3 is a moveable stage, in most embodiments. The UV lithography apparatus also includes an inert gas delivery system including gas delivery tubes 11 and an exhaust system with exhaust conduits 17. The stage and other components of the UV lithography apparatus shown in FIGS. 1A and 1B are disposed in a pressure controlled exposure chamber in various embodiments. The exposure chamber is where the UV lithography, i. e., patterning, takes place.

In some embodiments, the UV lithography apparatus is an EUV lithography apparatus. EUV light 19 is directed toward and impinges upon surface 7 of substrate 5 to expose portions of surface 7. EUV light 19 is produced by an extreme ultraviolet light source that emits photons when the light source becomes suitably energized. The light emitted by the EUV light source includes a wavelength of about 13.5 nm in some embodiments but other suitably short EUV wavelengths are used in other embodiments. In still other embodiments, ultraviolet light is used instead of EUV light 19, but the disclosure will be discussed in terms of EUV light and an EUV apparatus, hereinafter. One or multiple mirrors or other reflective members are used to direct EUV light 19 from the extreme ultraviolet light source to surface 7 of substrate 5. In some embodiments, the EUV light beam is directed to surface 7 by reflection off of a reticle, not shown, disposed over and parallel to substrate 5. When a patterning operation is being carried out, substrate 7 is coated with a photoresist material. Various suitable photoresists are used in various embodiments. Patterning takes place when the beams of EUV light 19 are directed to particular locations on surface 7 where they expose the photoresist and chemically alter the photoresist material, either rendering the chemically altered photoresist material soluble or insoluble in the subsequently used developer.

One aspect of the disclosure is that any flue gases or other contaminants that may result from the interaction between EUV light 19 and the photoresist material on surface 7, will be removed from the processing area by inert gas flow across surface 7 and removed through exhaust conduits 17. In this manner, the flue gases or other contaminants do not form contaminating films on other members of the lithography apparatus such as the reflective members. Further, the amount of outgassing is reduced.

Inert gases are delivered from an inert gas source by way of gas delivery channels 11 of the inert gas delivery system and are caused to flow across surface 7 of substrate 5. Arrows indicate the flow of the inert gases 13. In some embodiments, helium, neon, argon, krypton, xenon or radon are used as the inert gases but other inert gases are used in other embodiments. The flow rate of the inert gases may range from about 50 sccm to about 2000 sccm in various embodiments. The inert gas flow is laminar in some embodiments. In various embodiments, the size and shape of gas delivery channels 11 and outlet ports 15 are configured to produce a laminar sheet of gas flow, i.e. a layer of inert gas directed across surface 7 of substrate 5. The flow rates and total volume of inert gas are chosen in conjunction with the capabilities such as the pumping capabilities of the exhaust system which includes exhaust conduits 17. The flow rate is chosen such that the contaminants liberated from the photoresist film due to outgassing are quickly removed from the lithography area by the exhaust system including exhaust conduits 17.

Each gas delivery channel 11 includes an associated outlet port 15 that faces substrate 5 and is in close proximity to substrate 5. In some embodiments, the gas delivery channel or channels 11 are positioned no greater than 10 cm above substrate 5 and distance 21 between substrate 5 and gas delivery channels 11 is no greater than 10 cm in various embodiments although other arrangements are used in other embodiments. As indicated by the arrows, the inert gas 13 is maintained to flow parallel to surface 7 and as close to surface 7 as possible to minimize the amount of inert gas present in the lithography tool. In some embodiments, a number of individual gas delivery channels 11 surround substrate 5, each terminating at an individual port 15 that faces substrate 5. In this arrangement, the inert gasses 13 are directed toward substrate 5. In other embodiments, port 15 and gas delivery channels 11 are a continuous opening such as an open duct that extends circumferentially around substrate 5 and directs a laminar sheet of inert gas from 360° inwardly toward substrate 5 and over surface 7. In still other embodiments, gas delivery channel 11 is one or more open ducts that each extend partially around stage 3. In some embodiments, the exhaust system also circumferentially surrounds substrate 5. The exhaust system includes a number of separate exhaust conduits 17 in some embodiments and in other embodiments, the exhaust system includes the exhaust conduit 17 being an open duct that circumferentially surrounds substrate 5 and exhausts the inert gas at all locations around the 360° periphery of substrate 5. Various exhaust systems are used in various embodiments.

The configuration of the gas delivery channel or channels 11 and their placement in close proximity to surface 7 of substrate 5 and the location and pumping power of the exhaust system is chosen to minimize lag time, i.e. resonance time, of the inert gas in the vicinity of the substrate and within the chamber that contains stage 3 and substrate 5.

In some embodiments, further gas flow indicated by arrows 23 is used in conjunction with the inert gas flow previously described. Further gas flow 23 additionally suppresses problems associated with photoresist outgassing. In some embodiments, further gas flow 23 is directed between the reflective surfaces in the EUV lithography apparatus, and substrate 5 thereby preventing any flue gasses or other contaminants liberated from the photoresist layer from precipitating or otherwise depositing on the reflective optics or other components. In some embodiments, further gas flow 23 is $H_2$ and in other embodiments, further gas flow 23 is other suitable gasses.

Figure 2A:
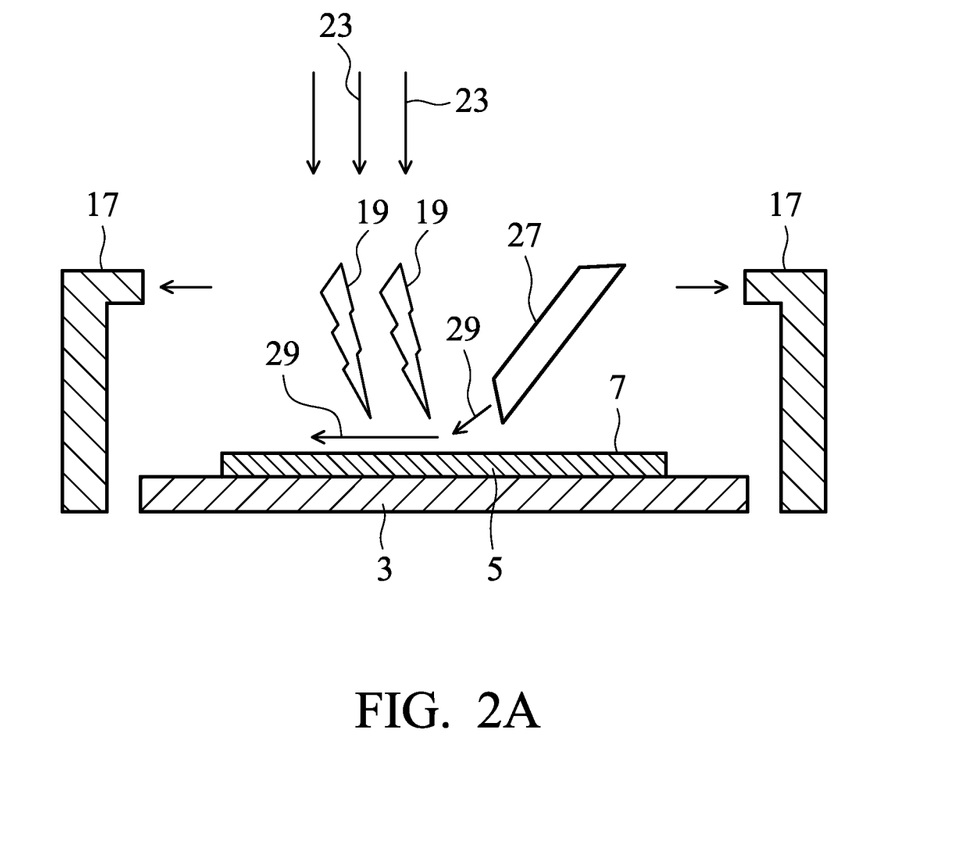
FIGS. 2A and 2B illustrate a side and plan view, respectively, of another arrangement for reducing outgassing in an EUV lithography apparatus according to an embodiment of the disclosure.
Figure 2B:
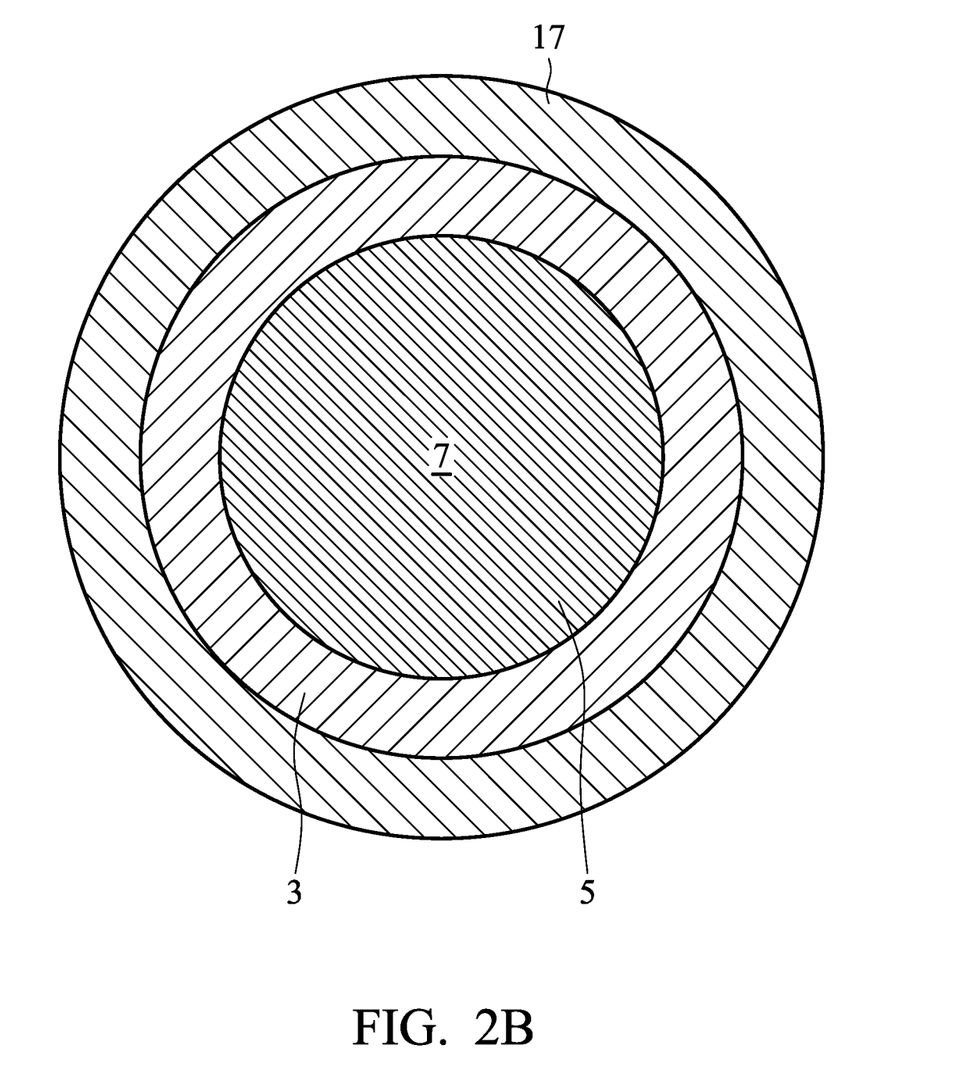

FIGS. 2A and 2B show a side view and plan view, respectively, of another arrangement according to the disclosure. Like numerals denote like features in FIGS. 1A, 1B and 2A, 2B. In FIGS. 2A and 2B, the gas delivery system does not include the gas delivery channels 11 shown in FIGS. 1A, 1B but, instead includes inert gas delivery channel 27 that delivers inert gas 29, as indicated by the arrows, to and across surface 7 of substrate 5. The inert gasses are as described in conjunction with FIGS. 1A, 1B. The flow rate of inert gas 29 is chosen in conjunction with the pumping power of the exhaust system including exhaust conduits 17 so that inert gasses 29 flow in a laminar manner across surface 7 and include a short resonance time within the lithography apparatus. Inert gas delivery channel 27 is in fixed position in some embodiments and inert gas delivery channel 27 is movable in other embodiments. In some embodiments, inert gas delivery channel 27 moves in conjunction with the movement of stage 3. In some embodiments, inert gas delivery channel 27 is a circular tube and in other embodiments, inert gas delivery channel 27 includes a wide opening that directs a sheet of inert gas across surface 7. In some embodiment, the wide opening is oblong with a principle axis parallel to surface 7. Inert gas delivery channel 27 is placed in close proximity to surface 7. Inert gas delivery channel is positioned at an acute angle with respect to surface 7 in some embodiments.

Figure 3A:
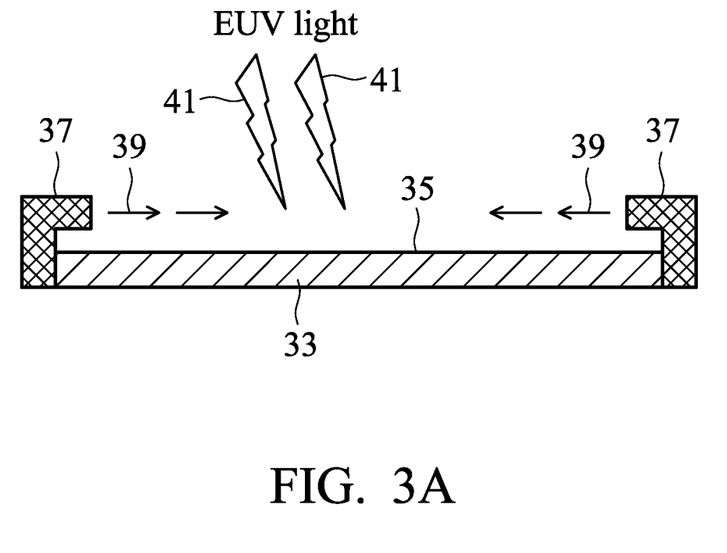
FIGS. 3A and 3B are side and top views, respectively, of an arrangement for reducing outgassing on a reflective surface in an EUV apparatus.
Figure 3B:
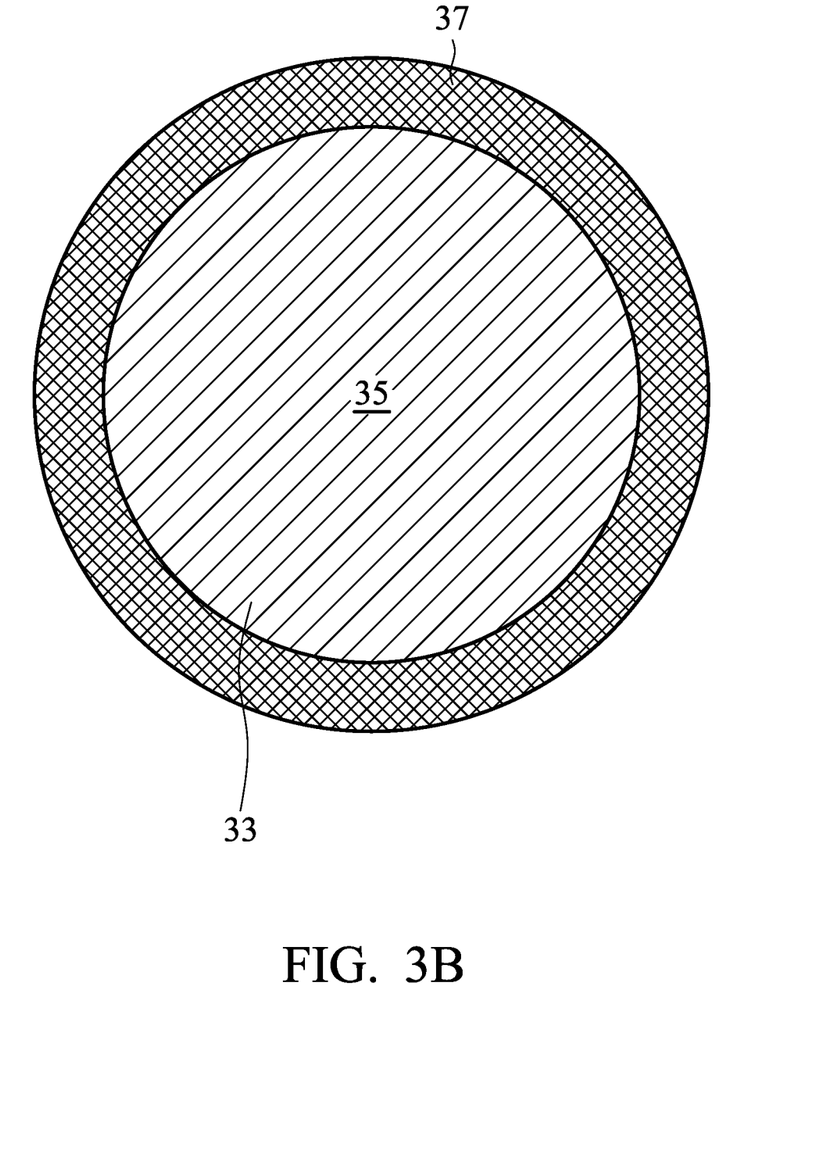

In some embodiments, an inert gas flow is used across the surface of one or more of the reflective members to avoid precipitation or other formation of films on the surface of the reflective member. FIGS. 3A, 3B are side and plan views, respectively, that show another aspect of the disclosure that is used in conjunction with the features shown in FIG. 1A, 1B, or 2A, 2B, in various embodiments. Reflective member 33 includes reflective surface 35. The lithography apparatus includes multiple reflective members 33 in various embodiments and the reflective members 33 are positioned in various locations to direct the EUV light from the EUV light source to the reticle and substrate. FIG. 3A shows EUV light 41 directed toward reflective surface 35. An inert gas delivery system including inert gas delivery conduits 37 directs inert gas 39, indicated by arrows, across reflective surface 35 of reflective member 33. Various configurations of inert gas delivery conduits 37 are used in various embodiments. In some embodiments, a number of individual delivery ports surround reflective member 33 and in other embodiments, inert gas delivery conduit 37 includes an opening that extends circumferentially around reflective member 33 and delivers inert gas 39 at 360° in a laminar sheet inwardly from the perimeter of reflective member 33. An exhaust system, not shown, is placed in close proximity to inert gas delivery conduit 37 and reflective surface 35 to remove inert gas 39 from the vicinity of the reflective member 33 and the lithography chamber to minimize the lag time, i.e. resonance time of inert gas 39 within the lithography processing apparatus.

Figure 4:
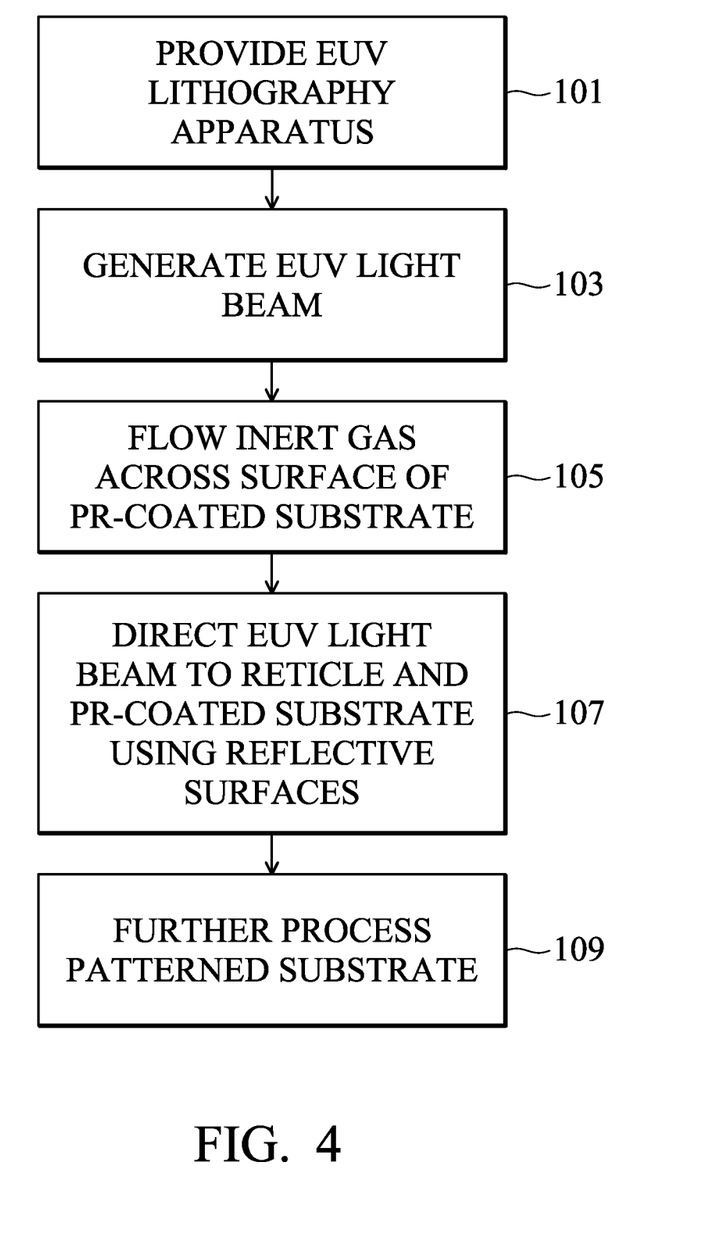
FIG. 4 is a flowchart showing a method according to the disclosure.

FIG. 4 is a flow chart showing a method according to an embodiment of the disclosure. At step 101, a UV lithography apparatus is provided. The UV apparatus may be an EUV lithography apparatus that includes a moveable stage for retaining the substrate, an inert gas delivery system, an exhaust system, reflective members and an EUV light source. The stage is in a pressure controlled exposure chamber in some embodiments. At step 103, an EUV light beam is generated. Step 105 includes flowing inert gas across a surface of a photoresist (PR)-coated substrate disposed on the stage. Step 105 includes exhausting the inert gas such that it maintains a short lag time within the lithography chamber. During step 105, inert gas is additionally directed to flow across one or more of the reflective members in some embodiments. Also during step 105, an $H_2$ or other gas is provided within a processing chamber to separate reflective members from any flue gas or other contaminants generated by outgassing of the photoresist. Step 107 provides for directing the EUV light to the reticle and PR-coated substrate using the reflective surfaces, thereby patterning the substrate. Step 109 provides for further processing the substrate and this includes developing the exposed, patterned surface, then performing subsequent processing operations to produce semiconductor devices.

According to one aspect, an ultraviolet (UV) lithography apparatus is provided. The apparatus comprises: a stage for receiving a substrate for patterning thereon; an ultraviolet (UV) light source that directs UV light onto a substrate disposed on the stage; a gas delivery source that causes an inert gas to flow across and in close proximity to a surface of the substrate disposed on the stage; and an exhaust system with exhaust ports capable of exhausting the inert gas.

According to another aspect, a method for forming a pattern on a semiconductor device is provided. The method comprises: providing an ultraviolet (UV) lithography apparatus including a stage for receiving a substrate thereon; directing an ultraviolet (UV) light beam to a substrate disposed on the stage; causing an inert gas to flow across and in close proximity to a surface of the substrate disposed on the stage; and exhausting the inert gas from the surface of the substrate.

According to another aspect, a method for forming a pattern on a semiconductor device is provided. The method comprises: providing an extreme ultraviolet (EUV) lithography apparatus including a stage for receiving a substrate thereon and at least one reflective member; directing an EUV light beam to a substrate disposed on the stage by reflection off of the at least one reflective member; causing a laminar sheet of inert gas to flow across and in close proximity to a surface of the substrate by delivering the inert gas from an open channel that at least partially surrounds the stage; and exhausting the inert gas from the surface of the substrate, wherein the inert gas comprises at least one of helium, neon, argon, krypton, xenon, and radon.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. An ultraviolet (UV) lithography apparatus comprising:
a stage for receiving thereon a substrate to be patterned;
an ultraviolet (UV) light source that directs UV light onto a substrate disposed on said stage;
an open duct that circumferentially surrounds said stage;
a gas delivery source that delivers an inert gas through said open duct and causes said inert gas to flow across and in close proximity to a surface of said substrate disposed on said stage; and
an exhaust system with exhaust ports capable of exhausting said inert gas.

2. The UV lithography apparatus as in claim 1, wherein said UV light source comprises an extreme ultraviolet (EUV) light source that emits EUV light having a wavelength of about 13.5 nm.

3. The UV lithography apparatus as in claim 2, wherein said EUV light source further comprises at least one reflective member capable of directing said EUV light onto said substrate and a further gas source that causes an inert gas to flow across and in close proximity to a surface of said at least one reflective member.

4. The UV lithography apparatus as in claim 2, wherein said gas delivery source causes said inert gas to flow across said surface at a flow rate of about 50 to 2000 sccm.

5. The UV lithography apparatus as in claim 1, wherein said gas delivery source causes said inert gas to flow across said surface at a flow rate of about 50 to 2000 sccm, said inert gas comprises at least one of helium, neon, argon, krypton, xenon and radon, and said stage is moveable.

6. The UV lithography apparatus as in claim 1, wherein said stage is within a chamber and said exhaust ports exhaust said inert gas from said chamber.

7. The UV lithography apparatus as in claim 1, wherein said stage is disposed within a chamber and said exhaust ports exhaust said inert gas from said chamber and further comprising a port that delivers hydrogen gas to said chamber.

8. The UV lithography apparatus as in claim 1, wherein said gas delivery source causes a laminar layer of said inert gas to flow in a direction parallel to a surface of said substrate.

9. A method for forming a pattern on a semiconductor device, said method comprising:
providing an ultraviolet (UV) lithography apparatus including a stage for receiving a substrate thereon, said stage circumferentially surrounded by an open gas delivery duct;
directing an ultraviolet (UV) light beam to a substrate disposed on said stage;
causing an inert gas to be delivered from a source, through said open gas delivery duct, and to flow across and in close proximity to a surface of said substrate disposed on said stage; and
exhausting said inert gas from said surface of said substrate.

10. The method as in claim 9, wherein said UV light beam comprises an extreme ultraviolet (EUV) light beam that emits light having a wavelength of about 13.5 nm.

11. The method as in claim 10, wherein said causing comprises causing said inert gas to flow across said surface at a flow rate of about 50 to 2000 sccm and said inert gas comprises at least one of helium, neon, argon, krypton, xenon and radon.

12. The method as in claim 10, wherein said directing an ultraviolet (UV) light beam comprises causing said EUV light beam to reflect off of a reticle onto said substrate thereby patterning said substrate and wherein said causing takes place during said patterning said substrate.

13. The method as in claim 10, wherein said causing includes causing said inert gas to flow in a direction parallel to a surface of said substrate.

14. The method as in claim 10, wherein said causing comprises causing a laminar layer of said inert gas to flow across said surface.

15. The method as in claim 9, wherein said stage is disposed within a chamber and said exhausting comprises exhausting said chamber and further comprising delivering hydrogen gas to said chamber.

16. The method as in claim 9, wherein said stage is a moveable stage.

17. The method as in claim 9, wherein said directing includes causing said UV light beam to reflect off of at least one reflective surface and further comprising causing an inert gas to flow across and in close proximity to a reflective surface of said at least one reflective surface.

18. A method for forming a pattern on a semiconductor device, said method comprising:
providing an extreme ultraviolet (EUV) lithography apparatus including a stage for receiving a substrate thereon and at least one reflective member;
directing an EUV light beam to a photoresist-coated substrate disposed on said stage by reflection off of said at least one reflective member;
causing a laminar layer of inert gas to flow across and in close proximity to a surface of said substrate by delivering said inert gas from an open duct that surrounds said stage; and
exhausting said inert gas from said surface of said substrate,
wherein said inert gas comprises at least one of helium, neon, argon, krypton, xenon, and radon.

* * * * *